(12) United States Patent
Robin et al.

(10) Patent No.: US 10,468,452 B2
(45) Date of Patent: Nov. 5, 2019

(54) METHOD OF MANUFACTURING A LED-BASED EMISSIVE DISPLAY DEVICE

(71) Applicant: Commissariat à l'Énergie Atomique et aux Énergies Alternatives, Paris (FR)

(72) Inventors: Ivan-Christophe Robin, Grenoble (FR); Hubert Bono, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/975,492

(22) Filed: May 9, 2018

(65) Prior Publication Data

US 2018/0331153 A1 Nov. 15, 2018

(30) Foreign Application Priority Data

May 11, 2017 (FR) ..................................... 17 54150

(51) Int. Cl.
| | |
|---|---|
| *H01L 27/15* | (2006.01) |
| *H01L 25/075* | (2006.01) |
| *H01L 25/16* | (2006.01) |
| *H01L 33/62* | (2010.01) |
| *H01L 27/12* | (2006.01) |
| *H01L 33/00* | (2010.01) |
| *H01L 33/38* | (2010.01) |

(52) U.S. Cl.
CPC ........ *H01L 27/156* (2013.01); *H01L 25/0753* (2013.01); *H01L 25/167* (2013.01); *H01L 27/124* (2013.01); *H01L 27/1259* (2013.01); *H01L 33/005* (2013.01); *H01L 33/382* (2013.01); *H01L 33/62* (2013.01); *H01L 27/15* (2013.01); *H01L 33/0079* (2013.01); *H01L 33/0095* (2013.01); *H01L 2933/0066* (2013.01)

(58) Field of Classification Search
CPC ......... H01L 25/167; H01L 2224/05542–0555; H01L 2224/0556–05565; H01L 2224/0618–06183; H01L 2033/0066; H01L 33/382; H01L 33/385
See application file for complete search history.

(56) References Cited

U.S. PATENT DOCUMENTS

| | | | | |
|---|---|---|---|---|
| 2004/0217360 A1* | 11/2004 | Negley | ................. | H01L 33/382 |
| | | | | 257/79 |
| 2007/0272939 A1* | 11/2007 | Peng | .................... | H01L 25/167 |
| | | | | 257/99 |

(Continued)

FOREIGN PATENT DOCUMENTS

FR 3 033 939 A1 9/2016

OTHER PUBLICATIONS

French Search Report for Application No. FR 1754150 dated Jan. 18, 2018.

*Primary Examiner* — Charles D Garber
*Assistant Examiner* — Alia Sabur
(74) *Attorney, Agent, or Firm* — Wolf, Greenfield & Sacks, P.C.

(57) ABSTRACT

A method of manufacturing elementary chips of a LED-based emissive display device, each chip including an inorganic semiconductor LED, a circuit for controlling the LED, and a plurality of areas of connection to an external device arranged on a connection surface of the chip.

12 Claims, 9 Drawing Sheets

(56) References Cited

U.S. PATENT DOCUMENTS

| | | | |
|---|---|---|---|
| 2009/0321775 A1* | 12/2009 | Hasnain | H01L 33/44 257/99 |
| 2010/0171215 A1* | 7/2010 | Fischer | H01L 21/561 257/734 |
| 2010/0267176 A1 | 10/2010 | Liu et al. | |
| 2010/0317132 A1* | 12/2010 | Rogers | H01L 25/0753 438/27 |
| 2011/0198609 A1* | 8/2011 | Huang | H01L 33/382 257/76 |
| 2011/0254035 A1* | 10/2011 | Kim | H01L 33/382 257/98 |
| 2014/0191246 A1* | 7/2014 | Oraw | H01L 25/167 257/76 |
| 2015/0108514 A1* | 4/2015 | Shi | H01L 33/145 257/88 |
| 2016/0064613 A1* | 3/2016 | Chiu | H01L 33/405 257/13 |
| 2016/0247855 A1 | 8/2016 | Von Malm | |
| 2016/0258588 A1 | 9/2016 | Grotsch et al. | |
| 2018/0247922 A1* | 8/2018 | Robin | H01L 25/167 |

\* cited by examiner

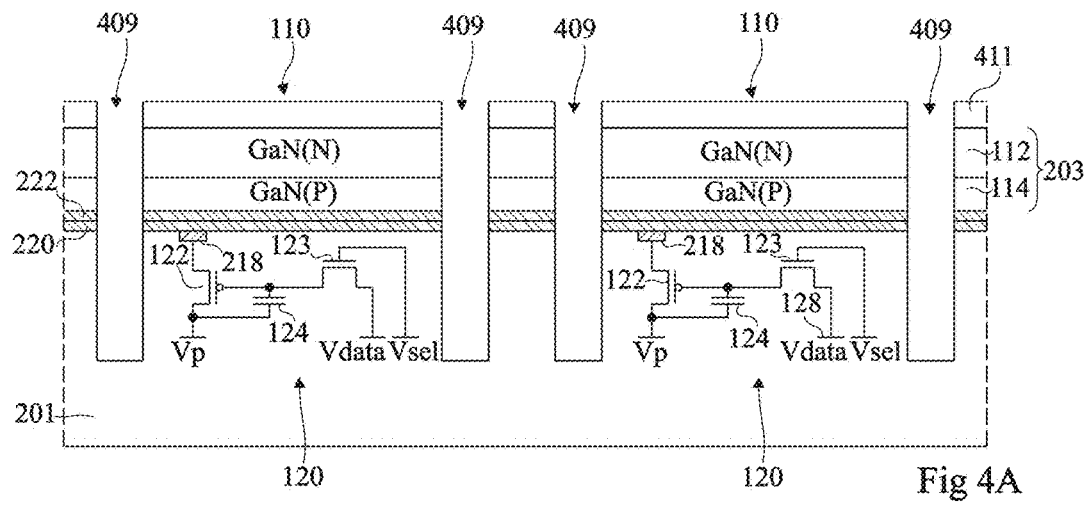
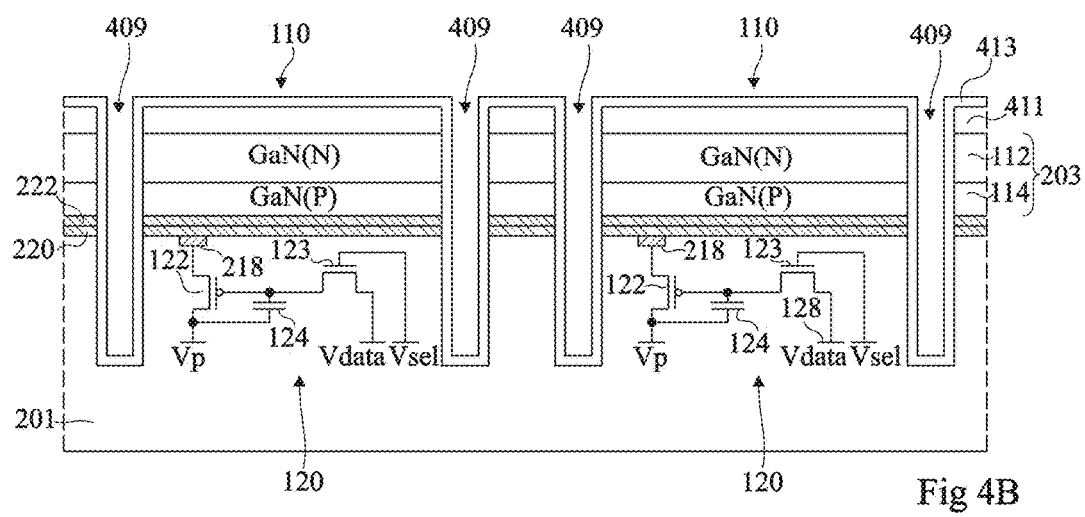
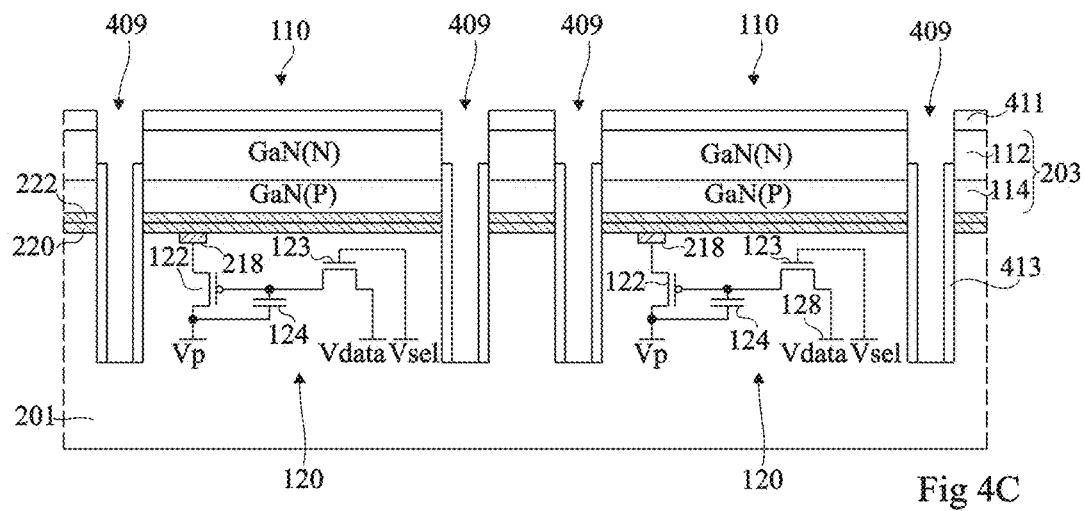

METHOD OF MANUFACTURING A LED-BASED EMISSIVE DISPLAY DEVICE

This application claims the priority benefit of French patent application number 17/54150, the content of which is hereby incorporated by reference in its entirety to the maximum extent allowable by law.

BACKGROUND

The present application concerns the forming of an emissive image display device comprising light-emitting diodes (LEDs), for example, a screen for a television, computer, smart phone, tablet, etc.

DISCUSSION OF THE RELATED ART

A method of manufacturing an image display device comprising a plurality of elementary electronic microchips arranged in an array on a same transfer substrate has already been provided, in French patent application Nr. 1561421 filed on Nov. 26, 2015. According to this method, the microchips and the transfer substrate are manufactured separately. Each microchip comprises a stack of a LED and of a circuit for controlling the LED. The control circuit comprises a connection surface opposite to the LED, comprising a plurality of electric connection areas intended to be connected to the transfer substrate for the control of the microchip. The transfer substrate comprises a connection surface comprising, for each microchip, a plurality of electric connection areas intended to be respectively connected to the electric connection areas of the microchip. The chips are then placed on the transfer substrate, with their connection surfaces facing the connection surface of the transfer substrate, and affixed to the transfer substrate to connect the electric connection areas of each microchip to the corresponding electric connection areas of the transfer substrate.

It would be desirable to be able to at least partly improve certain aspects of this method and/or of the display devices formed by this method.

SUMMARY

Thus, an embodiment provides a method of manufacturing elementary chips of a LED-based emissive display device, each chip including an inorganic semiconductor LED, a circuit for controlling the LED, and a plurality of areas of connection to an external device arranged on a connection surface of the chip, the method comprising the steps of:

a) forming the chip control circuits inside and on top of a semiconductor substrate so that each control circuit comprises a contact pad on the side of a first surface of the substrate;

b) placing on the first surface of the substrate a stack of LEDs comprising at least first and second semiconductor layers of opposite conductivity types, so that the second layer of the stack is electrically connected to the contact pads of the control circuits;

c) forming in each chip a peripheral trench surrounding, in top view, the control circuit and the LED of the chip, the peripheral trench extending vertically in the substrate along the entire height of the control circuit, crossing the second semiconductor layer of the LED stack, and at least partially penetrating into the first semiconductor layer of the LED stack;

d) forming in each trench a ring-shaped metallization in contact with the first semiconductor layer of the LED stack along the entire length of the trench; and e) cutting the substrate and the LED stack along cutting paths located, in top view, outside of the peripheral trenches of the chips to individualize the chips.

According to an embodiment, in each chip:

the surface of the ring-shaped metallization opposite to the first semiconductor layer of the LED stack emerges onto a second surface of the substrate opposite to the first surface and defines a first connection area of the chip; and at least one second electric connection area connected to the control circuit of the chip is formed on the second surface of the substrate.

According to an embodiment, the trenches are formed from the second surface of the substrate, after the forming of said at least one second electric connection area.

According to an embodiment, the trenches thoroughly cross the substrate and the second semiconductor layer of the LED stack and are interrupted in the first semiconductor layer of the LED stack.

According to an embodiment, the method comprises, between step c) and step d), a step of conformal deposition of an insulating layer on the lateral walls and on the bottom of the trenches, and a step of removing said insulating layer from the bottom of the trenches to free the access to the first semiconductor layer of the LED stack.

According to an embodiment, the trenches are formed from the surface of the LED stack opposite to the substrate, before the forming of said at least one second electric connection area.

According to an embodiment, the trenches thoroughly cross the LED stack and penetrate into the substrate down to a depth greater than or equal to the thickness of the control circuit.

According to an embodiment, the method comprises, between step c) and step d), a step of conformal deposition of an insulating layer on the lateral walls and on the bottom of the trenches, and a step of removing said insulating layer from an upper portion of the lateral walls of the trenches, to free the access to the first semiconductor layer of the LED stack.

According to an embodiment, the method further comprises, before step a), a step of depositing a first metal layer continuously extending over substantially the entire first surface of the substrate, and a step of depositing a second metal layer continuously extending over substantially the entire surface of the second semiconductor layer of the LED stack opposite to the first semiconductor layer of said stack.

According to an embodiment, at step b), the affixing of the LED stack onto the substrate is performed by direct bonding of the first metal layer to the second metal layer.

Another embodiment provides a method of manufacturing a LED-based emissive display device, comprising the steps of:

forming a plurality of elementary chips by a method such as defined hereabove;

forming a transfer substrate comprising, for each chip, on a connection surface of the transfer substrate, a plurality of connection areas intended to be respectively connected to the connection areas of the chip; and affixing the chips onto the transfer substrate to electrically connect the chip connection areas to the corresponding connection areas of the transfer substrate.

According to an embodiment, at the end of step e), the chips are arranged on a support substrate with a pitch between chips smaller than the pitch between chips of the final display device; and only part of the chips of the support substrate are affixed to the transfer substrate at the pitch of the final display device and are selectively detached from the support substrate.

Another embodiment provides an elementary chip of a LED-based emissive display device, comprising an inorganic semiconductor LED, a circuit for controlling the LED, and a plurality of areas of connection to an external device, wherein:

the control circuit is formed inside and on top of a semiconductor substrate and comprises a contact pad on the side of a first surface of the substrate;

the LED is formed in a LED stack comprising at least first and second semiconductor layers of opposite conductivity types, the second layer of the stack being electrically connected to the contact pad of the control circuit;

at least one peripheral trench surrounds, in top view, the control circuit and the LED of the chip, the ring-shaped trench extending vertically along the entire height of the control circuit, crossing the second semiconductor layer, and at least partially penetrating into the first semiconductor layer of the LED stack; and a ring-shaped metallization arranged in the ring-shaped trench is in contact with the first semiconductor layer of the LED stack all along the trench length.

According to an embodiment, a stack of first and second metal layers extending over substantially the entire surface of the control circuit forms an interface between the control circuit and the LED of the chip.

Another embodiment provides a LED-based emissive display device comprising:

a plurality of elementary cells such as defined hereabove; and a transfer substrate comprising, for each chip, on a connection surface of the transfer substrate, a plurality of connection areas respectively connected to the connection areas of the chip.

The foregoing and other features and advantages will be discussed in detail in the following non-limiting description of specific embodiments in connection with the accompanying drawings.

BRIEF DESCRIPTION OF THE DRAWINGS

FIGS. 4A, 4B, 4C, 4D, 4E, and 4F are cross-section views illustrating steps of another example of a method of manufacturing elementary microchips of a LED-based emissive display device according to an embodiment;

DETAILED DESCRIPTION

Figure 1:
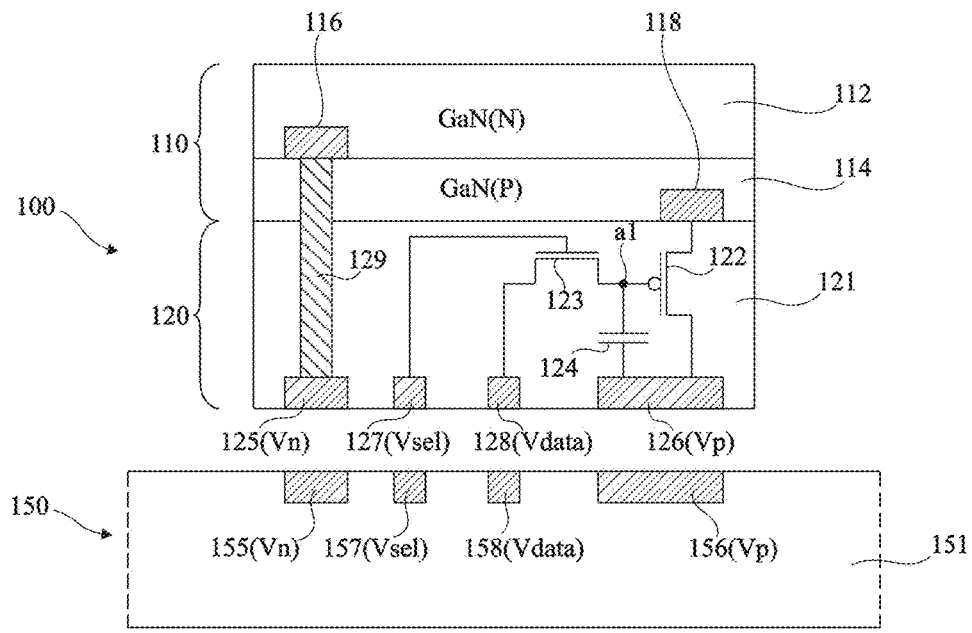
FIG. 1 is a cross-section view schematically illustrating a step of transfer of a microchip onto a transfer substrate, according to an example of a method of manufacturing a LED-based emissive display device.

The same elements have been designated with the same reference numerals in the various drawings and, further, the various drawings are not to scale. For clarity, only those steps and elements which are useful to the understanding of the described embodiments have been shown and are detailed. In particular, the manufacturing of the LEDs and of the circuits for controlling the elementary microchips, and of the transfer substrate of the described display devices has not been detailed, the manufacturing of these elements being within the abilities of those skilled in the art based on the teachings of the present description.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the corresponding drawings, it being understood that, in practice, the described devices may be oriented differently. The terms "approximately", "substantially", and "in the order of" are used herein to designate a tolerance of plus or minus 10%, preferably of plus or minus 5%, of the value in question.

FIG. 1 is a cross-section view schematically and partially illustrating a step of transferring a microchip 100 onto a transfer substrate 150, according to an example of a method of manufacturing a LED-based emissive display device.

FIG. 1 more particularly shows microchip 100 and transfer substrate 150 before the actual step of affixing the microchip onto the transfer substrate.

In particular, a display device may comprise a plurality of identical or similar elementary chips 100 assembled on a same transfer substrate according to layout in an array of rows and columns, the chips being connected to elements of electric connection of the substrate for the control thereof, and each microchip for example corresponding to a pixel of the display device.

Microchip 100 comprises, in an upper portion, an inorganic semiconductor LED 110 and, in a lower portion forming one piece with the upper portion, an active control circuit 120 formed inside and on top of a semiconductor substrate, for example, made of single-crystal silicon, capable of controlling the emission of light by the LED.

LED 110 comprises at least one homojunction or one heterojunction, for example, a PN junction formed of a stack of an upper N-type semiconductor layer 112 and of a lower P-type semiconductor layer 114, and two electric contacts 116 and 118, respectively on layer 112 and on layer 114, to inject an electric current through the stack, in order to generate light. As an example, LED 110 is a gallium nitride (GaN) LED or is based on any other adapted III-V semiconductor.

Control circuit 120 is formed inside and on top of a semiconductor substrate 121, for example, a single-crystal silicon block, and comprises electronic components, and particularly one or a plurality of transistors and at least one capacitive element for maintaining a polarization signal, for the individual control of LED 110. The lower surface of circuit 120, defining a connection surface of the microchip, comprises a plurality of electric connection areas intended to be connected to corresponding electric connection areas of transfer substrate 150 for the control of the microchip. In the shown example, the lower surface of circuit 120 comprise four electric connection areas 125, 126, 127, and 128. Areas 125 and 126 are intended to respectively receive a low power supply potential (for example, the ground) Vn and a high power supply potential (that is, higher than the low power supply potential) Vp of the microchip. Areas 127 and 128 are intended to receive microchip control signals. More particularly, area 127 is intended to receive a microchip selection signal Vsel, and area 128 is intended to receive a signal Vdata for setting the luminosity level of the microchip. Connection areas 125, 126, 127, and 128 are for example made of metal, for example, of copper. In this example, control circuit 120 comprises two MOS transistors 122 and 123 and one capacitive element 124, for example, a capacitor. Transistor 122, for example, a P-channel transistor, has a first conduction node (source or drain) connected to the connection area 126 (Vp) of the microchip, a second conduction node (drain or source) connected to anode contact terminal 118 of LED 110, and a control node (gate) connected to an intermediate node al of circuit 120. Capacitive element 124 has a first electrode connected to node al and a second electrode connected to connection area 126 (Vp) of the microchip. Transistor 123, for example, an N-channel transistor, has a first conduction node connected to the connection area 128 (Vdata) of the microchip, a second conduction node connected to node al, and a control node connected to connection area 127 (Vsel) of the microchip. Microchip 100 further comprises an insulated conductive via 129 connecting electric connection area 125 (Vn) of the microchip to cathode contact terminal 116 of LED 110.

Elementary microchip 100 operates as follows during a phase of updating the luminosity level of the pixel. Transistor 123 is turned on (made conductive) by the application of an adapted control signal to terminal 127 (Vsel). Capacitive element 124 then charges to a voltage level which is a function of the adjustment signal applied to terminal 128 (Vdata) of the microchip. The level of adjustment signal Vdata sets the potential of node al, and accordingly the intensity of the current injected into the LED by transistor 122, and thus the light intensity emitted by the LED. Transistor 123 can then be turned back off. Node al then remains at a potential substantially equal to potential Vdata. Thus, the current injected into the LED remains substantially constant after the turning back off of transistor 123, and this, until the next update of the potential of node al.

Transfer substrate 150 for example comprises a support plate or sheet 151 made of an insulating material, having electric connection elements, for example, conductive tracks and areas, arranged thereon. Transfer substrate 150 is for example a passive substrate, that is, it only comprises electric connection elements for conveying the microchip control and power supply signals. Transfer substrate 150 comprises a connection surface, its upper surface in the shown example, intended to receive microchips 100. For each microchip of the display device, transfer substrate 150 comprises, on its connection surface, a plurality of electric connection areas (one per electric connection area of the microchip) intended to be respectively connected to the electric connection areas of the microchip. Thus, in this example, for each microchip 100 of the display device, transfer substrate 150 comprises four electric connection areas 155, 156, 157, and 158 intended to be respectively connected to electric connection areas 125, 126, 127, and 128 of microchip 100, to convey control signals Vn, Vp, Vsel, and Vdata of the microchip. Electric connection areas 155, 156, 157, and 158 of the transfer substrate are for example made of the same conductive material as electric connection areas 125, 126, 127, and 128 of the microchips, for example, copper.

During the transfer of microchip 100 onto transfer substrate 150, the connection surface of the microchip is placed in contact with the connection surface of the transfer substrate to electrically connect electric connection areas 125, 126, 127, and 128 of the microchip respectively to the corresponding electric connection areas 155, 156, 157, and 158 of the transfer substrate. The affixing of microchip 100 to the transfer substrate is for example performed by direct bonding, that is, with no added adhesive or solder material at the interface between the microchip and the substrate.

FIGS. 2A to 2M are cross-section views illustrating successive steps of an example of a method of manufacturing elementary microchips 200 of a LED-based emissive display device according to an embodiment. FIGS. 2A to 2M more particularly show the simultaneous forming of two neighboring microchips, it being understood that, in practice, the number of simultaneously-formed microchips may be much larger.

Microchips 200 formed by the method of FIGS. 2A to 2M comprise elements common with microchips 100 described in relation with FIG. 1. In particular, like microchips 100 of FIG. 1, microchips 200 of FIGS. 2A to 2M each comprise an inorganic semiconductor LED 110 and an active control circuit 120 capable of controlling the emission of light by the LED. As in the example of FIG. 1, control circuit 120 comprises a first surface mechanically and electrically in contact with a surface of LED 110, and a second surface opposite to the first surface, defining a connection surface of the microchip, comprising areas of connection to an external device. The common elements between microchips 100 of FIG. 1 and microchips 200 of FIGS. 2A to 2M will not be detailed again.

Figure 2A:
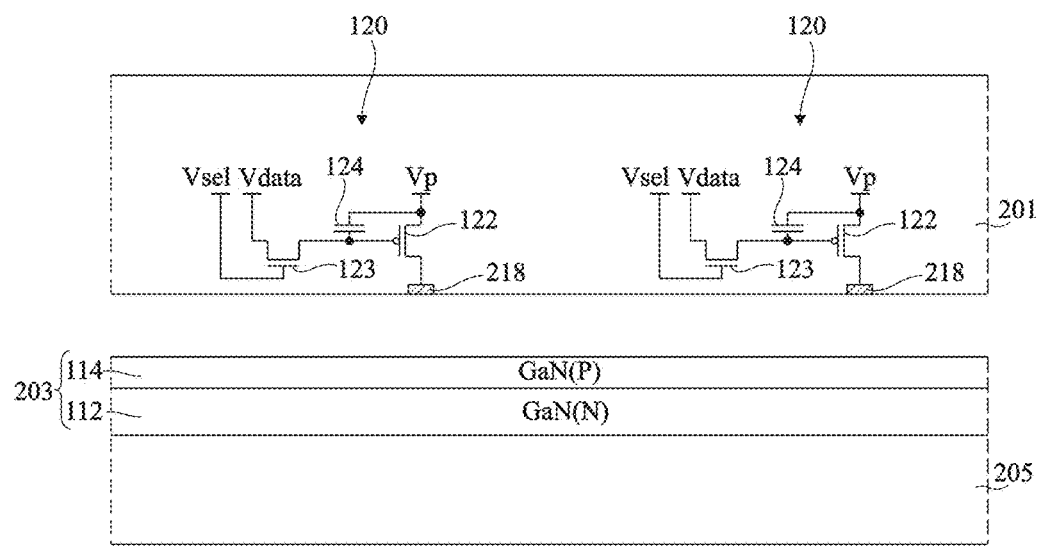
FIGS. 2A, 2B, 2C, 2D, 2E, 2F, 2G, 2H, 2I, 2J, 2K, 2L, and 2M are cross-section views illustrating steps of an example of a method of manufacturing elementary microchips of a LED-based emissive display device according to an embodiment.

FIG. 2A illustrates a step of forming control circuits 120 of microchips 200 inside and on top of a semiconductor substrate 201, for example, made of silicon. As an example, substrate 201 is a solid semiconductor substrate, or a substrate of semiconductor on insulator type (SOI). In this example, each elementary control circuit 120 substantially comprises the same components as in the example of FIG. 1, arranged substantially in the same way. Transistors 122 and 123 and capacitive element 124 of each control circuit 120 are formed inside and on top of substrate 201, on the side of a surface of substrate 201 which will be called front surface of the substrate hereafter. In each control circuit 120, at least one electric connection pad intended to be connected to LED 110 of the microchip is formed on the front surface side of substrate 201. More particularly, in the shown example, each control circuit 120 comprises, on the front surface side of substrate 201, an electric connection pad 218 connected to the conduction node of transistor 122 which is not connected to capacitive element 124, intended to be connected to LED 110. As an example, electric connection pads 218 are made of metal and are laterally surrounded with an insulating material, for example, silicon oxide, so that control circuit 120 has a substantially planar front surface. At this stage, the areas of connection to the outside 125, 126, 127, and 128 of the microchips have not been formed yet. These connection areas will be formed later on, on the rear surface side of substrate 201.

FIG. 2A further illustrates a separate step of forming of an inorganic LED stack 203 on a surface of a growth substrate 205. Growth substrate 205 is for example a substrate made of sapphire or of silicon. As an example, stack 203 is a gallium nitride LED stack comprising, on the upper surface of growth substrate 205, a PN junction formed of a stack of a lower N-type gallium nitride layer 112 and of an upper P-type gallium nitride layer 114. More generally, any other inorganic LED stack, for example, made up of III-V semiconductor, may be formed at this step on the upper surface of growth substrate 205. It should in particular be noted that stack 203 may comprise an emissive layer, not detailed in the drawings, for example, formed of a stack of one or a plurality of emissive layers, each forming a quantum well, between N-type layer 112 and P-type layer 114. Stack 203 is for example formed by epitaxy on the upper surface of growth substrate 205.

Figure 2B:
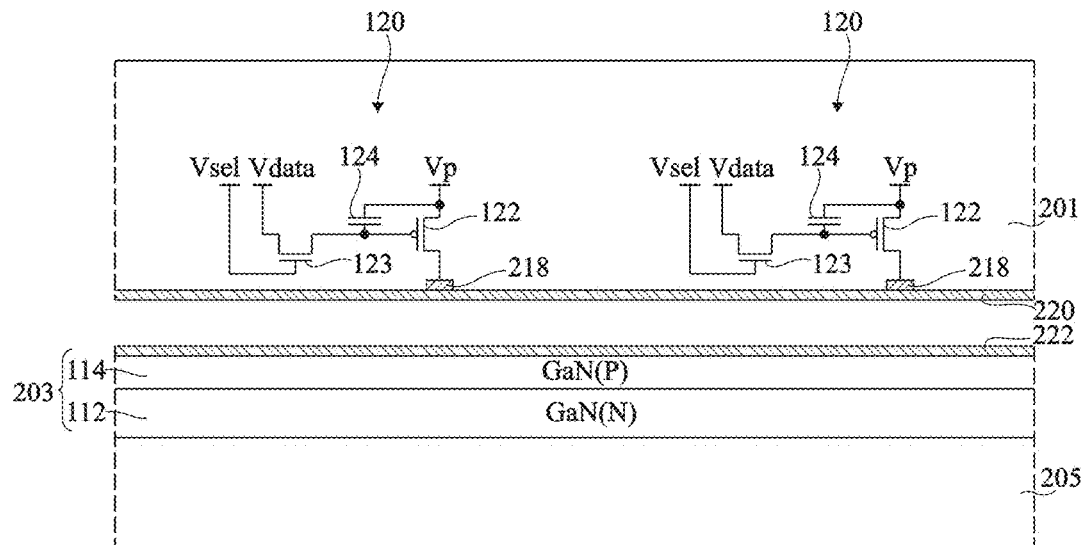

FIG. 2B illustrates a step of depositing, on the front surface of substrate 201, a metal layer 220. In the shown example, metal layer 220 coats substantially the entire front surface of substrate 201. In particular, layer 220 coats the entire front surface of each control circuit 120, and is in contact with connection pad 218 of the control circuit.

FIG. 2B further illustrates a step of depositing, on the upper surface of LED stack 203, a metal layer 222. In the shown example, metal layer 222 is arranged on top of and in contact with the upper surface of P-type semiconductor layer 114. Metal layer 222 for example coats substantially the entire upper surface of stack 203.

Figure 2C:
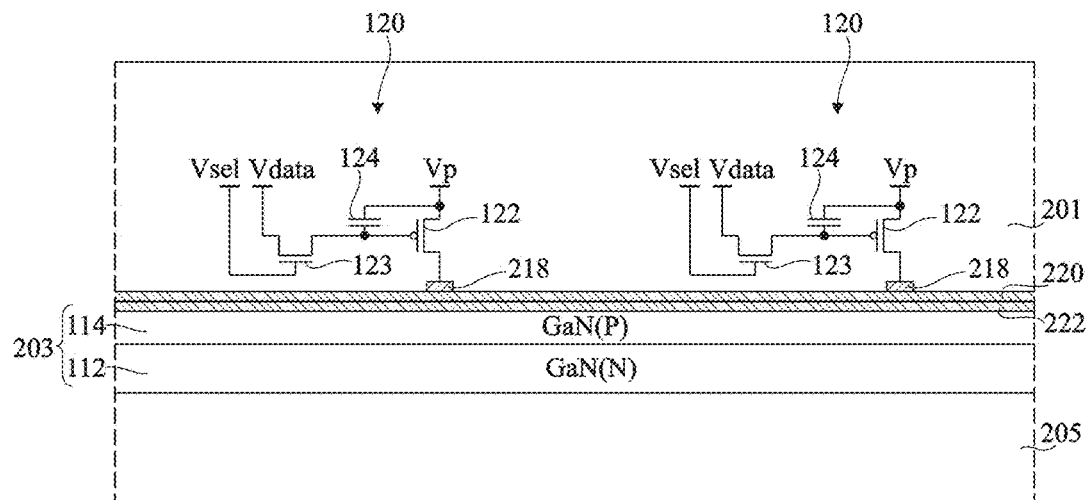

FIG. 2C illustrates a step of transfer of LED stack 203 onto the upper surface of substrate 201. To achieve this, the surface of metal layer 220 opposite to substrate 201 is placed in contact with the surface of metal layer 222 opposite to substrate 205. During this step, LED stack 203 is rigidly attached to control circuits 120 formed inside and on top of substrate 201. Further, the P-type layer 114 of LED stack 203 is electrically connected to connection pad 218 of each control circuit 120 via metal layers 220 and 222. As an example, the affixing of LED stack 203 onto substrate circuit 201 may be obtained by direct bonding between the contact surfaces of layers 220 and 222. For this purpose, layers 220 and 222 are preferably of same nature, for example made of copper, of titanium, or of aluminum. Further, a step of preparing the contact surfaces of metal layers 220 and 222 may be provided prior to the transfer, for example, a chem.-mech. polishing (CMP) step, to obtain a sufficient surface evenness, for example, a roughness smaller than 1 nm, to perform a direct bonding between layers 220 and 222. An anneal may possibly be provided after the bonding, for example, at a temperature in the range from 150 to 250° C., to increase the bonding force. At this stage, LED stack 203 is a continuous stack (not divided into individual LEDs) extending over substantially the entire surface of semiconductor substrate 201.

Figure 2D:
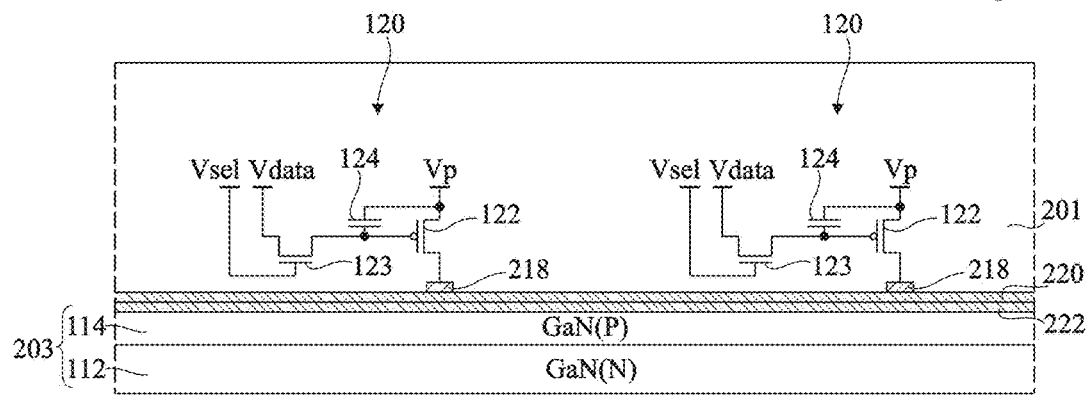

FIG. 2D illustrates a step of removing growth substrate 205 from LED stack 203. In the case of a growth substrate 205 made of sapphire, the latter may for example be separated from stack 203 by means of a laser beam projected through substrate 205 from its surface opposite to stack 203. In the case of a growth substrate 205 made of silicon, the latter may for example be removed by grinding and etching, for example, by means of an etch solution based on potassium hydroxide, or by reactive ion etching (RIE). The removal of growth substrate 205 results in freeing the access to the lower surface of N-type semiconductor layer 112 of LED stack 203.

Figure 2E:
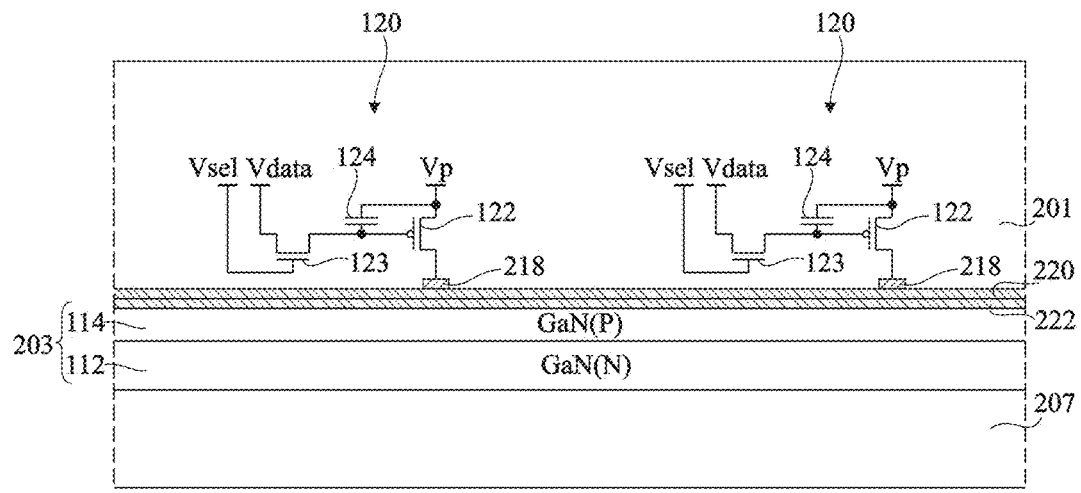

FIG. 2E illustrates a step during which a support substrate 207 is bonded to the lower surface of N-type semiconductor layer 112 of LED stack 203, to replace growth substrate 205. Substrate 207 is affixed to layer 112 by a so-called temporary bonding, having a bonding energy smaller than the initial bond between the microchips and the LED growth substrate, to ease a subsequent microchip collection step. As an example, support substrate 207 is a transparent adhesive film capable of being separated by UV irradiation.

As a variation, the steps of FIGS. 2D and 2E may be omitted, growth substrate 205 of LED stack 203 being then used as a support substrate for the rest of the process.

Figure 2F:
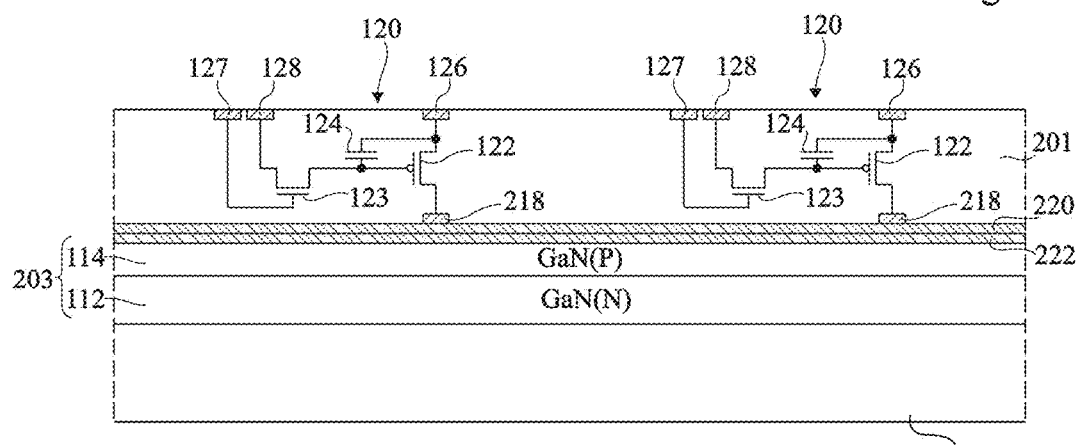
Figure 5:
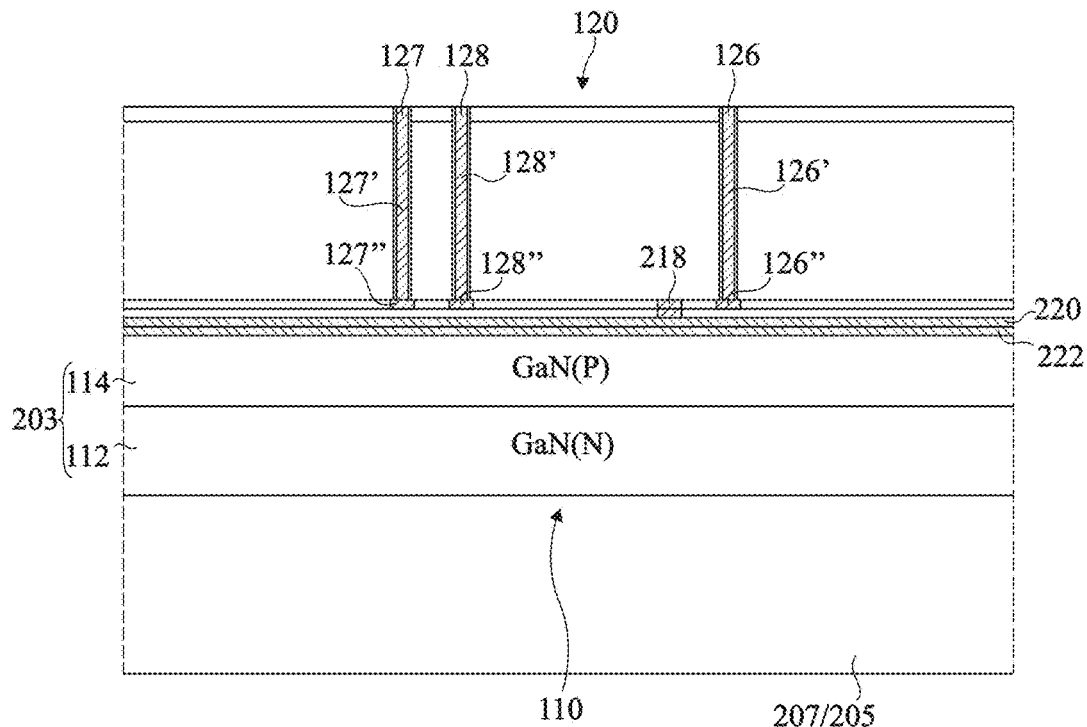
FIG. 5 is a cross-section view illustrating in further detail a step of the method of FIGS. 2A to 2M.

FIG. 2F illustrates a step of forming electric connection areas of the microchips on the rear surface side of substrate 201. During this step, only the connection areas of the microchip contacting the components of control circuit 120 of the microchip, that is, connection areas 126, 127, and 128, are formed in each microchip, using the reference numerals of FIG. 1. In particular, the electric connection area 125 contacting N-type semiconductor layer 112 of LED stack 203 is not formed at this step. Substrate 201 may be previously thinned from its lower surface, for example, by grinding, to ease the access to the components of control circuits 120 to be contacted. Electric connection areas 126, 127, 128 are for example made of metal, for example, of copper. As an example, electric connection areas 126, 127, 128 are connected to the components of control circuits 120 via insulated conductive vias 126', 127', 128' thoroughly crossing substrate 201 and contacting metallizations 126", 127", and 128" previously formed on the front surface side of substrate 201, as illustrated in further detail in FIG. 5.

Figure 2G:
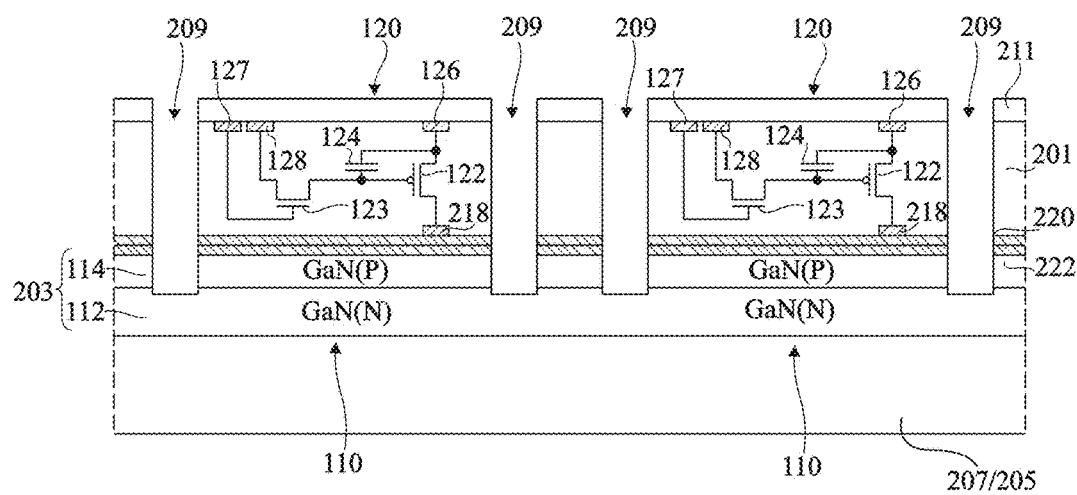

FIG. 2G illustrates a step of forming, in each microchip, from the rear surface of substrate 201, a ring-shaped peripheral trench 209 totally surrounding, in top view, control circuit 120 and LED 110 of the microchip. Each trench 209 extends vertically from the rear surface of substrate 201, thoroughly crosses substrate 201, metal layers 220 and 222, and P-type semiconductor layer 114 of LED stack 203, penetrates into N-type semiconductor layer 112 and is interrupted at an intermediate level between the upper surface and the lower surface of semiconductor layer 112. Trenches 209 are for example formed by etching, for example, by inductively coupled plasma reactive ion etching (ICP-RIE). An etch mask 211, for example, made of silicon oxide is previously formed on the rear surface of substrate 201 to delimit the etching areas.

Figure 2H:
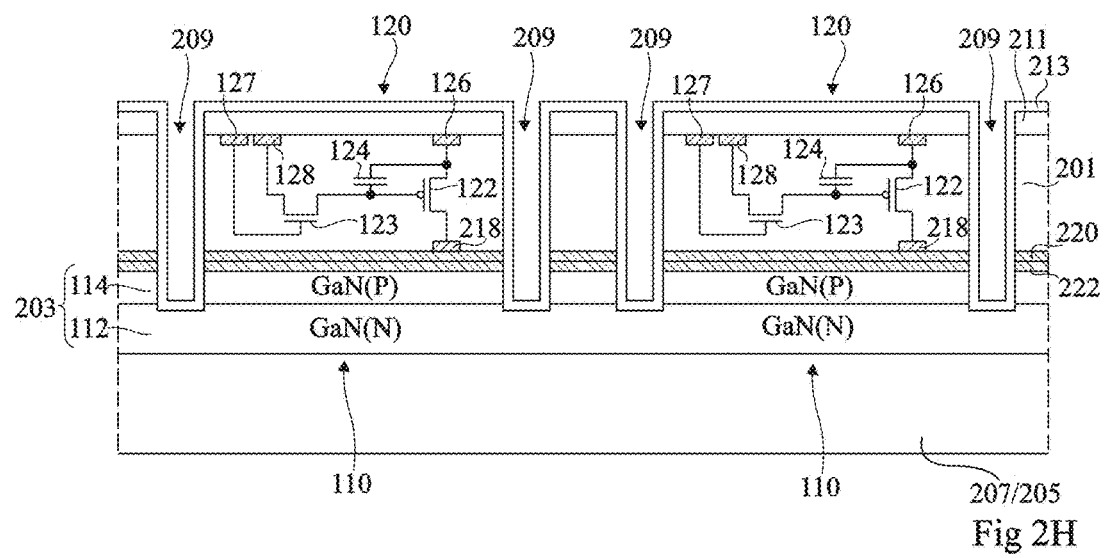

FIG. 2H illustrates a step of conformal deposition of an electrically-insulating layer 213, for example, a silicon oxide layer, on the lateral walls and on the bottom of trenches 209. In the shown example, layer 213 is a continuous layer extending over substantially the entire upper surface of the structure obtained at the end of the step of FIG. 2G. Layer 213 is for example formed by plasma enhanced chemical vapor deposition (PECVD) or by atomic layer deposition (ALD).

Figure 2I:
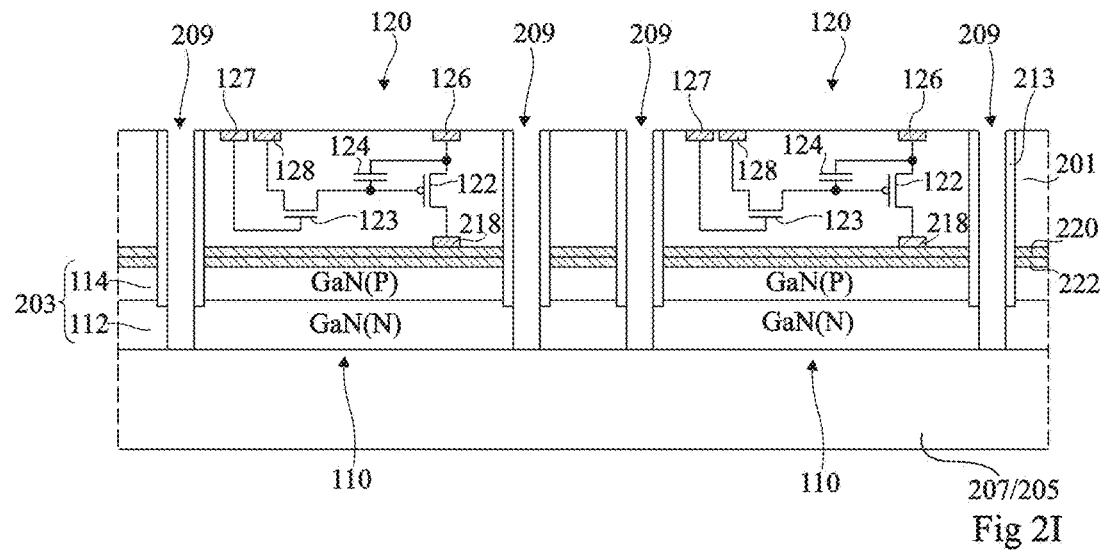

FIG. 2I illustrates a step of removing insulating layer 213 from the bottom of trenches 209, to free the access to lower semiconductor layer 112 of LED stack 203. During this step, layer 213 is kept on the sides of trenches 209. As an example, to remove layer 213 from the bottom of trenches 209 while keeping it on the side of the trenches, a directional etching may be implemented, to obtain an etch speed in the vertical direction much greater than the etch speed in the horizontal direction (in the orientation of FIG. 2I).

FIG. 2I further illustrates a step of etching semiconductor layer 112 of LED stack 203 at the bottom of trenches 209, for example by inductively coupled plasma reactive ion etching. In other words, after the removal of insulating layer 213 from the bottom of trenches 209, trenches 209 are extended through semiconductor layer 112 of the LED stack, down to the upper surface of support substrate 207 or of growth substrate 205.

Mask 211 previously deposited for the forming of trenches 209 can then be removed, for example, by etching, to free the access to the upper surface of electric connection areas 126, 127, and 128 of control circuits 120.

Figure 2J:
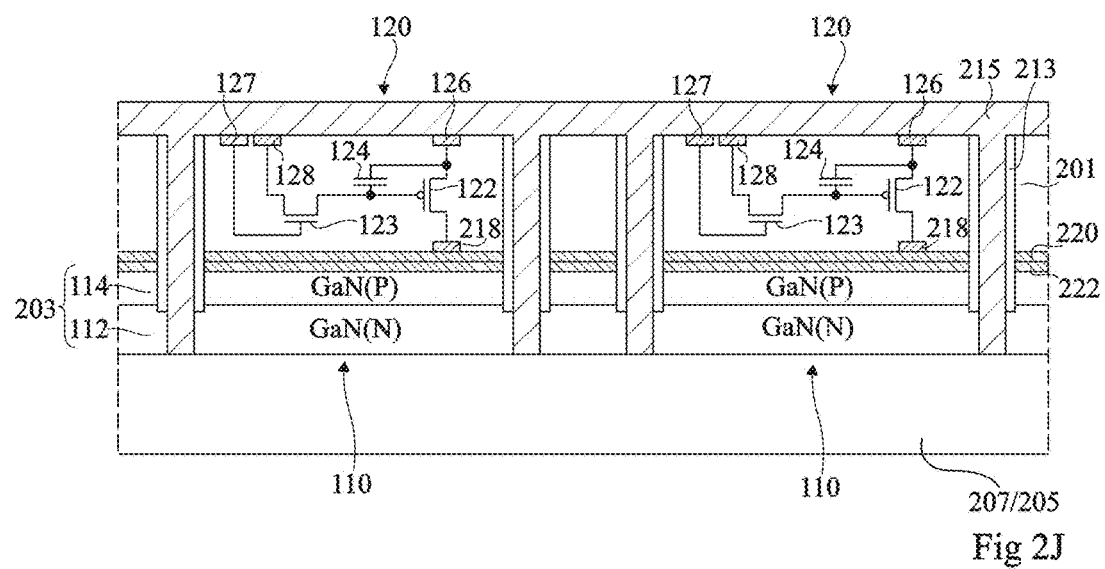

FIG. 2J illustrates a step of filling trenches 209 with a conductive metal, for example, copper. In the shown example, during this step, a continuous metal layer 215 is deposited over the entire upper surface of the assembly, that is, not only in trenches 209, but also on the rear surface of substrate 201. As an example, the forming of layer 215 comprises a first step of conformal deposition of a seed layer to take an electric contact on lower semiconductor layer 112 of the LED stack, at the level of the lateral walls of the extensions of trenches 209 formed at the previous step, and then a second step of depositing a thicker metal layer, for example, an electrochemical deposition of copper, to fill trenches 209.

Figure 2K:
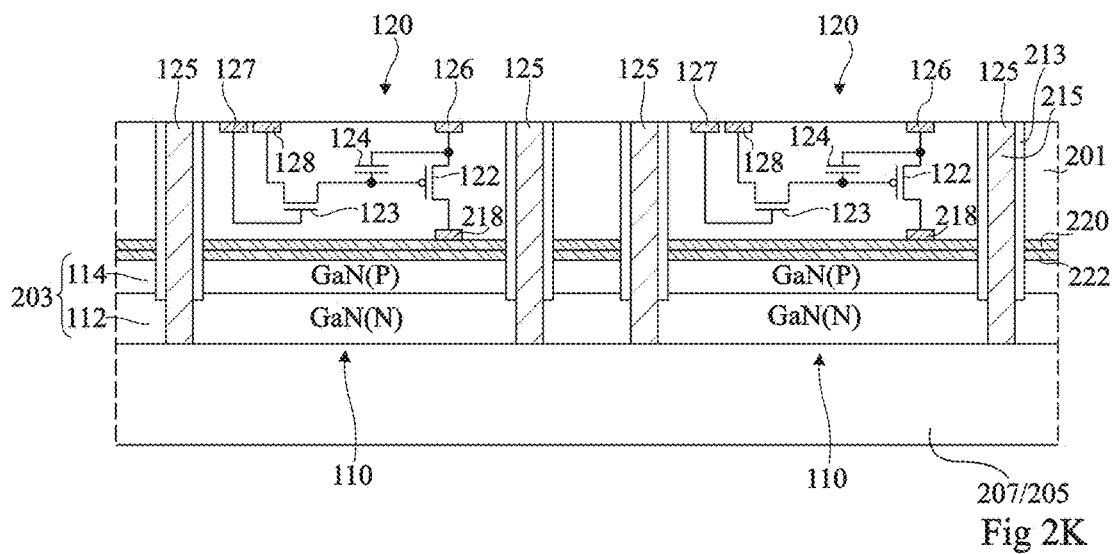

FIG. 2K illustrates a step of chem.-mech. polishing (CMP) of the upper surface of the assembly obtained at the end of the steps of FIG. 2J, to remove metal layer 215 outside of trenches 209 and particularly from the rear surface of control circuits 120. At the end of this step, a monolithic assembly having a substantially planar rear surface is obtained. In each microchip, the previously-formed electric connection areas 126, 127, and 128 are flush with the level of the rear surface or connection surface of the microchip. Further, each microchip now comprises, in addition to electric connection areas 126, 127, and 128, a ring-shaped metallization 215 arranged in peripheral trench 209 of the microchip, connected to lower semiconductor layer 112 of LED 110 of the microchip, and insulated from upper semiconductor layer 114 of the LED and from the sides of control circuit 120 by insulating layer 213. Ring-shaped metallization 215 is flush with the rear surface of the microchip and forms the electric connection area 125 of the microchip (with the notation of FIG. 1). At this stage, the electric connection areas 125, 126, 127, and 128 of each microchip are laterally separated by an insulating material, for example, silicon oxide.

Figure 2L:
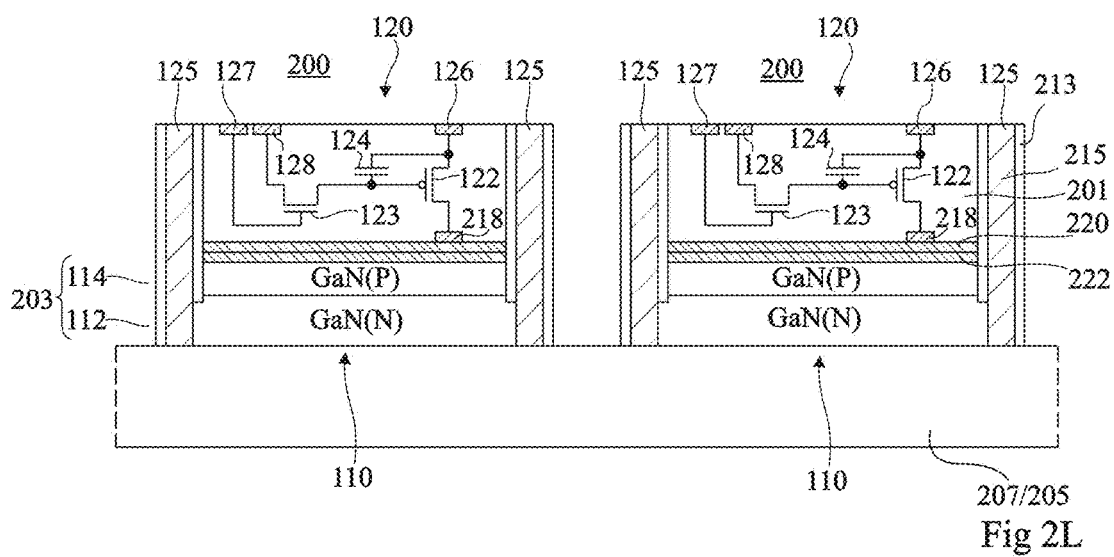

FIG. 2L illustrates a step of cutting substrate 201, metal layers 220 and 222, and LED stack 203 along cutting paths located, in top view, between peripheral trenches 209 of the microchips, to individualize the microchips. As an example, the cutting of the microchips may be performed by inductively coupled plasma reactive ion etching, an etch mask being previously arranged on the upper surface of the assembly to define the cutting paths.

At the end of this step, microchips 200 are totally separated from one another, mechanically and electrically, and are affixed to support substrate 207 or to growth substrate 205 only by their lower surface (on the side of LED 110).

Figure 2M:
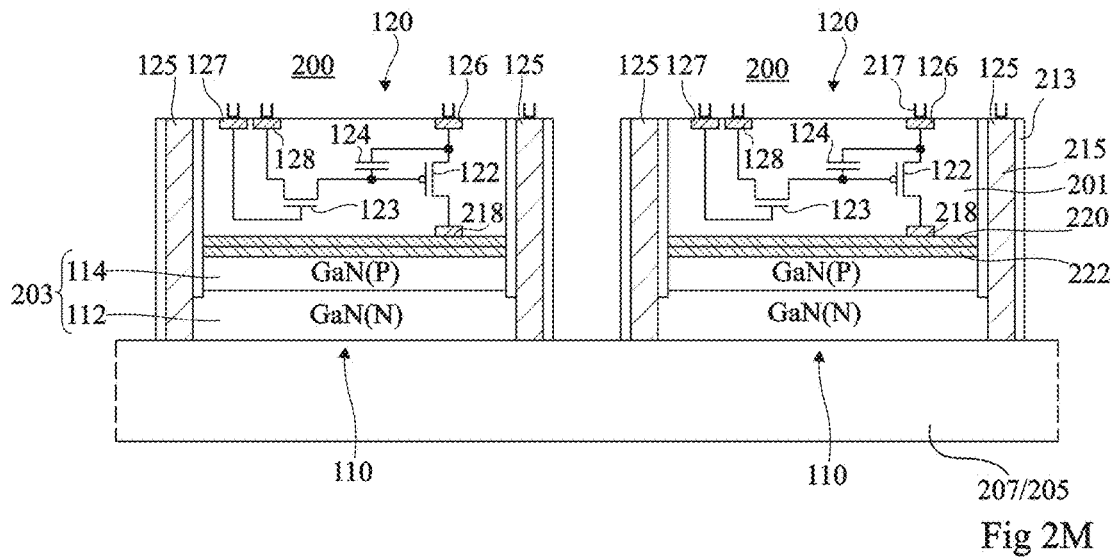

FIG. 2M illustrates an optional step of forming conductive microstructures 217 on the upper surface of electric connection areas 125, 126, 127, and 128 of each microchip 200, to ease the subsequent affixing of the microchips to an external device. As an example, microstructures 217 are metal microtubes, for example, made of tungsten, formed by a method of the type described in patent application US2011/094789. As a variation, microstructures 217 are microtips of the type described in patent application US2008/190655.

Figure 3A:
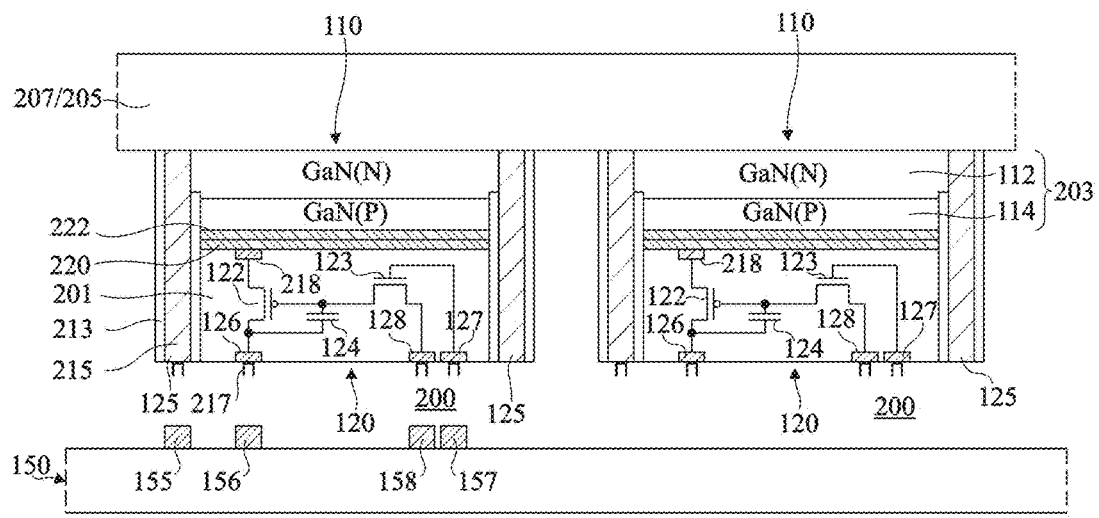
FIGS. 3A and 3B are cross-section views illustrating steps of an example of a method of manufacturing a LED-based emissive display device based on microchips formed by the method of FIGS. 2A to 2M.
Figure 3B:
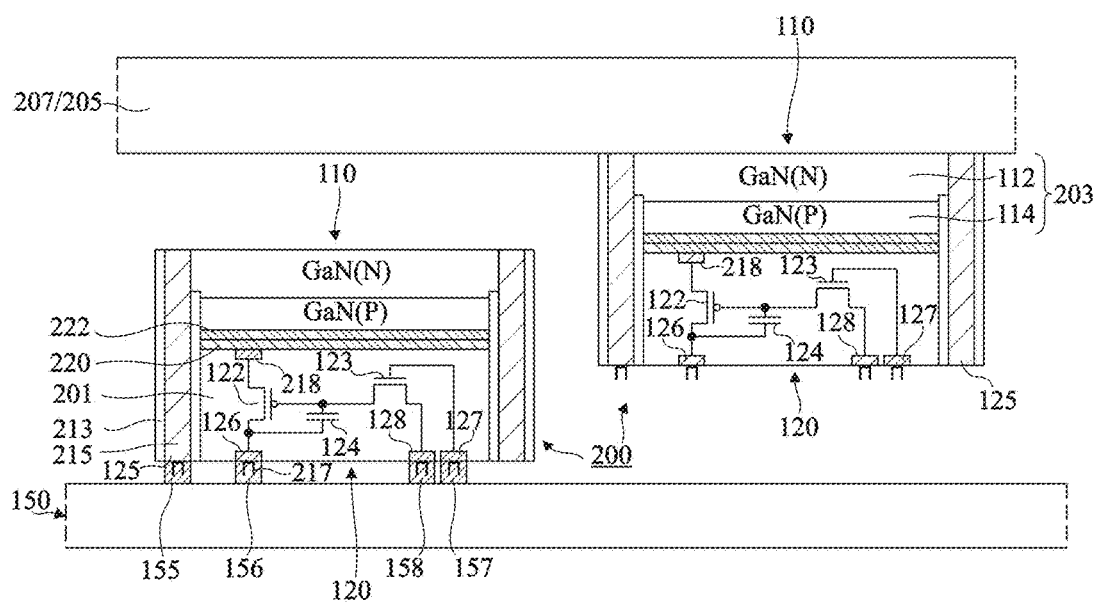

FIGS. 3A and 3B are cross-section views illustrating steps of an example of a method of manufacturing a LED-based emissive display device based on microchips formed by the method of FIGS. 2A to 2M.

FIG. 3A illustrates a step during which, after having formed, on the one hand, microchips 200 on a support substrate 207 or 205 by the method of FIGS. 2A to 2M and, on the other hand, transfer substrate 150, microchips 200 are positioned opposite the corresponding transfer areas of transfer substrate 150, with the connection surfaces of the microchips facing the connection surface of transfer substrate 150, using support substrate 207 or 205 as a handle.

Microchips 200 are then affixed to transfer substrate 150 by bonding of the electric connection areas of the microchips onto the corresponding electric connection areas of the transfer substrate (FIG. 3B). Microchips 200 are then detached from support substrate 207 or 205, and the latter is removed.

In practice, as illustrated in FIGS. 3A and 3B, the pitch of the microchips on support substrate 207 or 205, for example, approximately in the range from 10 to 50 µm, may be smaller than the pitch of the final device after transfer onto substrate 150, for example in the range from 15 µm to 1 mm, for example, approximately in the range from 100 to 500 µm. As an example, the pitch of the microchips on transfer substrate 150 is a multiple of the pitch of the microchips on support substrate 207 or 205. Thus, during the forming of the display device, it is provided to only transfer part of the microchips of support substrate 207 or 205 onto transfer substrate 150, with the pitch of transfer substrate 150 and then, if need be, to shift the support substrate with the remaining microchips to transfer another part of the microchips onto substrate 150, and so on until all the microchips of the display device have been affixed to substrate 150.

For each iteration, once one or a plurality of microchips 200 have been affixed onto transfer substrate 150, they are selectively detached from support substrate 207 or 205. The support substrate and the remaining microchips are then removed as illustrated in FIG. 3B.

To selectively detach microchips 200 from the support substrate, a light bonding may be provided between the support substrate and the microchips, so that only the microchips affixed to electric connection areas of transfer substrate 150 are torn during the removal of the support substrate, under the effect of the bonding force between the electric connection areas of the microchip and the electric connection areas of the transfer substrate.

In the shown example, electric connection areas 155, 156, 157, and 158 of transfer substrate 150 protrude from the upper surface of the transfer substrate, so that, during the transfer, only the microchips 200 intended to be affixed to the substrate are effectively placed in contact with the transfer substrate. This enables to ease the selective separation of the microchips and the removal of the support substrate and of the remaining microchips once the affixing has been performed.

As an example, microchips 200 are bonded to the support substrate by means of a polymer of type C4F8, TEFLON, or OPTOOL DSX, or by any other adhesive providing a bonding energy between microchips 200 and the support substrate smaller than the bonding energy between the microchips and the transfer substrate.

As a variation, in the case where the support substrate is transparent, the bonding of microchips 200 to the support substrate may be achieved with a resin capable of being degraded by an ultraviolet radiation. A local laser illumination of the resin may then be performed through the support substrate, to selectively detach part of microchips 200.

In the case where the support substrate is the growth substrate of LEDs 110, the latter may have a relatively strong adherence to microchips 200. In this case, a method of selective separation by means of a local laser beam projected through the support substrate, for example, a method of the type described in patent application U.S. Pat. No. 6,071,795, may be used.

As previously indicated, the described embodiments are not limited to the shown specific case where microstructures are formed on the electric connection areas of the microchips. As a variation, the electric connection areas of the microchips may be smooth, and the affixing of the microchips to transfer substrate 150 may be performed by direct bonding of the electric connection areas of the microchips to the corresponding electric connection areas of the support substrate. A step of preparing of the contact surfaces of the electric connection areas of the microchips and of the transfer substrate may possibly be provided prior to the transfer, so as to obtain a sufficient surface evenness to obtain a direct bonding between the electric connection areas of the microchips and of the transfer substrate.

It should further be noted that the described embodiments are not limited to the example of FIGS. 3A and 3B where the electric connection areas of the transfer substrate are protruding from the connection surface of the transfer substrate. As a variation, the connection surface of the transfer substrate may be substantially planar as in the example of FIG. 1.

An advantage of the display device obtained by the method described in relation with FIGS. 2A to 2M, 3A and 3B is that each microchip comprises a ring-shaped metallization 215 contacting N-type semiconductor layer 112 of LED 110 all along the LED periphery. This enables to improve the electric injection, and thus the light efficiency of the LED, with respect to microchips of the type illustrated in FIG. 1.

Further, due to the presence of metal layers 222 and 220, P-type semiconductor layer 114 of LED 110 is contacted across its entire surface opposite to layer 112. Here again, this enables to improve the electric injection and thus the light efficiency of the LED with respect to microchips of the type illustrated in FIG. 1.

Further, the presence of ring-shaped metallization 215 laterally delimiting LED 110 enables to improve the emission directivity of the microchip, and particularly to avoid for light to be laterally emitted towards the other microchips of the device.

For this purpose, it should be noted that it is advantageous, at the step described in relation with FIG. 2I, after the removal of insulating layer 213 from the bottom of trenches 209, for trenches 209 to be extended all the way to the upper surface of the support substrate 207/205, so that the ring-shaped metallizations 215 extends all the way to the upper surface (in the orientation of FIG. 3B) or emission surface of the microchips. The described embodiments are however not limited to this specific case. As a variation, after the removal of insulating layer 213 from the bottom of trenches 209, trenches may be partially extended (that is, without thoroughly crossing semiconductor layer 112) or not be extended at all. The optical separation between pixels ensured by metallizations 215 will then be a little less efficient, but the function of electric contacting on semiconductor layer 112 will remain ensured by metallizations 215.

Further, it should be noted that in the microchip manufacturing method described in relation with FIGS. 2A to 2M, during the step of transfer of LED stack 203 onto substrate 201 inside and on top of which the control circuits 120 of the microchips having been previously formed (FIG. 2C), the positions of the different LEDs 110 in stack 203 have not been defined yet. There is accordingly no strong alignment accuracy constraint during the transfer. This is an advantage over the method described in above-mentioned French patent application Nr. 1561421, where an array of individualized LEDs and an array of elementary control circuits are formed separately, and then transferred onto each other, which requires an accurate alignment during the transfer due to the small dimensions of the microchips.

FIGS. 4A to 4F are cross-section views illustrating successive steps of another example of a method of manufacturing elementary microchips 400 of a LED emissive display device according to an embodiment. The method of FIGS. 4A to 4F and the microchips 400 formed by this method comprise elements common with the method of FIGS. 2A to 2M and with the microchips 200 formed by the method of FIGS. 2A to 2M. Hereafter, only the differences between the two embodiments will be highlighted.

The initial steps of the method of FIGS. 4A to 4F are identical or similar to the steps previously described in relation with FIGS. 2A to 2D.

FIG. 4A illustrates a step during which, starting from the structure obtained at the end of the step of FIG. 2D, that is, after the removal of growth substrate 205 of LED stack 203, in each microchip, from the surface of LED stack 203 opposite to control circuit 120, that is, the upper surface of stack 203 in the orientation of FIG. 4A, a ring-shaped peripheral trench 409 totally surrounding, in top view, control circuit 120 and LED 110 of the microchip is formed. Trench 409 extends vertically from the upper surface of LED stack 203, thoroughly crosses LED stack 203 and metal layers 220 and 222, and penetrates into substrate 201 down to a depth greater than or equal to the final thickness of control circuit 120 of microchip 400 (that is, at least down to the future connection surface of the microchip) without however thoroughly crossing substrate 201. It should be noted that at this stage, substrate 201 has not been thinned yet to form the electric connection areas of the microchip, and may be used as a support handle to form trenches 409. Trenches 409 are for example formed by etching, for example, by inductively coupled plasma reactive ion etching (ICP-RIE). An etch mask 411, for example, made of silicon oxide is previously formed on the upper surface of LED stack 203 to delimit the etching areas.

FIG. 4B illustrates a step of conformal deposition of an electrically-insulating layer 413, for example, a silicon oxide layer, on the lateral walls and on the bottom of trenches 409. In the shown example, layer 413 is a continuous layer extending over substantially the entire upper surface of the structure obtained at the end of the steps of FIG. 4A. Layer 413 is for example formed by plasma enhanced chemical vapor deposition (PECVD) or by atomic layer deposition (ALD).

FIG. 4C illustrates a step of removing insulating layer 413 from an upper portion of the lateral walls of trenches 409, to free the access to the sides of semiconductor layer 112 of LED 110 of each microchip. Insulating layer 413 is however kept on the lower surface of the lateral walls of the trench, and in particular on the sides of the lower semiconductor layer 114 of LED 110 and on the sides of the control circuit 120 of each microchip. The partial removal of insulating layer 413 is for example achieved by means of a directional etch method, for example, by inductively coupled plasma reactive ion etching, for example, by means of a fluorinated plasma. During this step, layer 413 may further be removed from the bottom of trenches 409 and from the upper surface of the LED stack, as shown in FIG. 4C. Further, etch mask 411 may be removed. Preferably, it is provided at this step to form or to keep an insulating protection layer on the upper surface of LED stack 203. In the shown example, the protection layer is formed by a residue of etch mask 411.

Figure 4D:
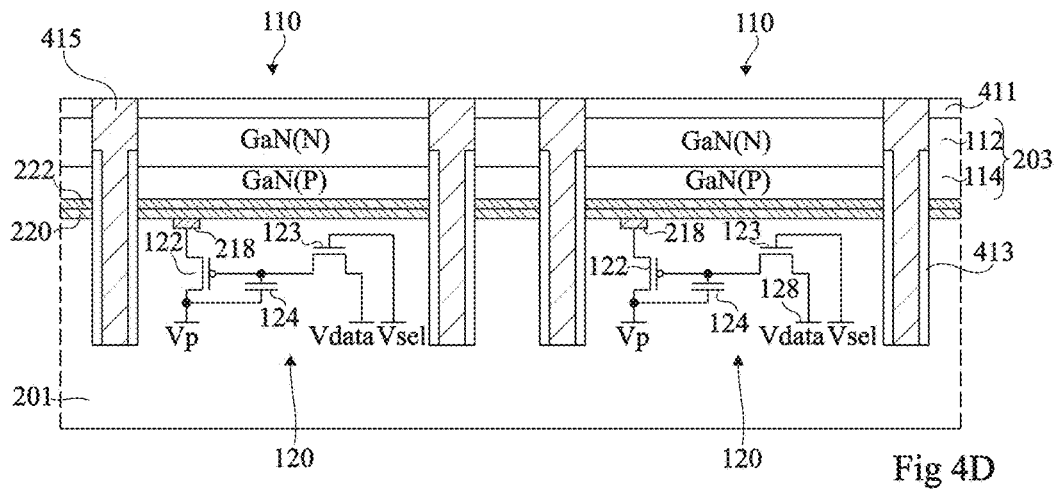

FIG. 4D illustrates a step of filling trenches 409 with a conductive metal 415, for example, copper, similarly to what has been described in relation with FIG. 2J. A step of chem.-mech. polishing may be implemented to remove the metal deposited outside of the trenches and to planarize the upper surface (in the orientation of FIG. 4D) of the structure, where the polishing may for example be interrupted on the upper surface of insulating layer 411.

Figure 4E:
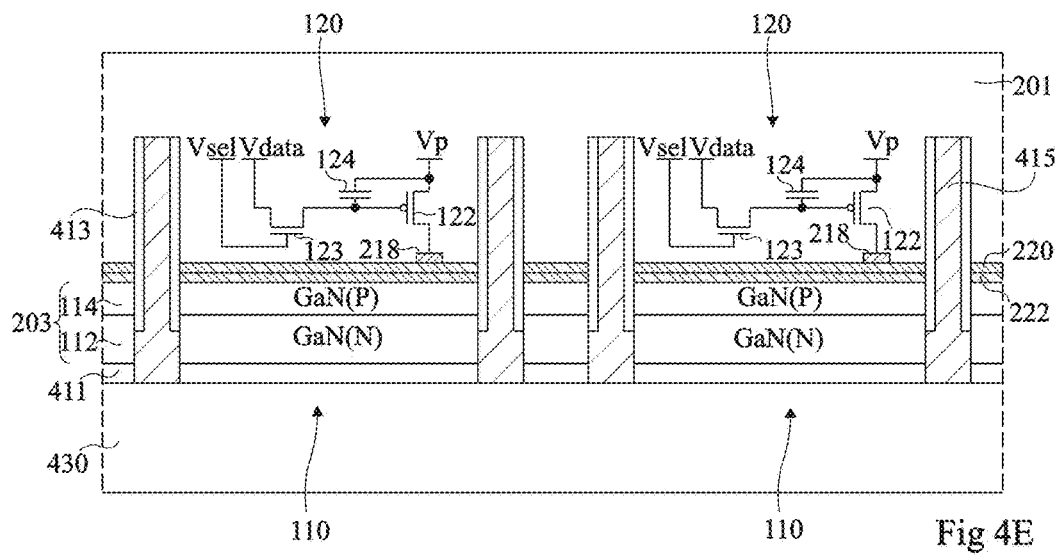

FIG. 4E illustrates a step of transfer of the structure obtained at the end of the step of FIG. 4D onto a temporary support substrate 430. During this step, the upper surface of the structure of FIG. 4D (LED side) is bonded to a surface of support substrate 430.

Figure 4F:
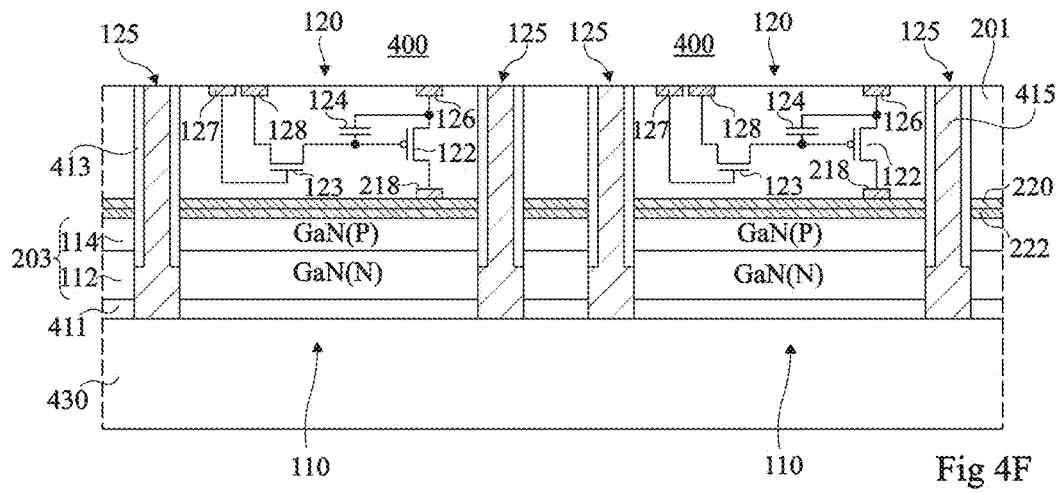
Figure 6:
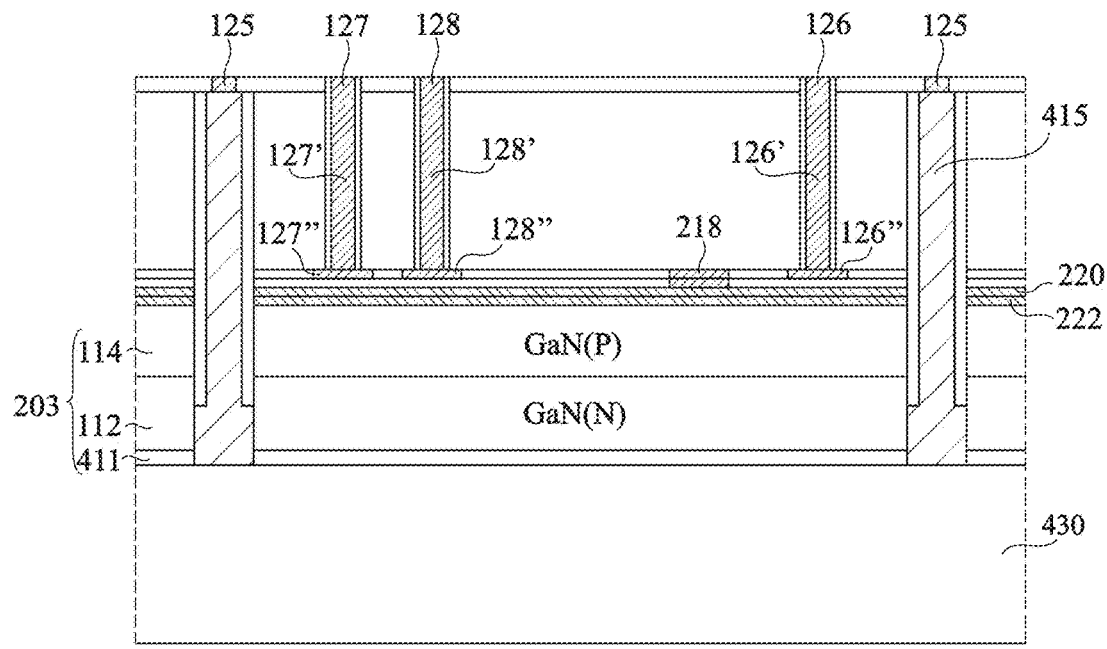
FIG. 6 is a cross-section view illustrating in further detail a step of the method of FIGS. 4A to 4F.

FIG. 4F illustrates a step of forming of the electric connection areas of microchips 400 on the rear surface side of substrate 201, using support substrate 430 as a handle. During this step, substrate 201 is thinned from its rear surface, for example, by grinding, to reach metallizations 415 previously formed in trenches 409. The rear surface of each metallization 415 defines the connection area 125 of the corresponding microchip. After the thinning of substrate 201, the connection areas contacting components of control circuit 120 of the microchip, that is, connection areas 126, 127, and 128, are formed on the rear surface of substrate 201. Electric connection areas 126, 127, 128 are for example made of metal, for example, of copper. As an example, electric connection areas 126, 127, 128 are connected to the components of control circuits 120 via insulated conductive vias 126', 127', 128' thoroughly crossing substrate 201 and contacting metallizations 126", 127", 128" previously formed on the front surface side of substrate 201, as illustrated in further detail in FIG. 6.

The next steps of the method are for example identical or similar to what has been previously described in relation with FIGS. 2L, 2M, 3A, and 3B (individualization of microchips 400 and transfer onto a transfer substrate 150 to form a display device).

Specific embodiments have been described. Various alterations, modifications, and improvements will occur to those skilled in the art. In particular, it will be within the abilities of those skilled in the art to adapt the described examples by inverting the conductivity types of semiconductor layers 112 and 114 of LED stack 203.

Further, although only embodiments where the microchips transferred onto the transfer substrate each comprise a LED and a circuit for controlling the LED have been described, the described embodiments are not limited to this specific case. As a variation, each microchip may comprise a plurality of LEDs and an active circuit for controlling the plurality of LEDs.

Further, the described embodiments are not limited to the shown examples where each microchip comprises four electric connection areas.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing elementary chips of a LED-based emissive display device, each chip comprising an inorganic semiconductor LED, a circuit for controlling the LED, and a plurality of areas of connection to an external device arranged on a connection surface of the chip, the method comprising the steps of:
   a) forming the control circuits of the chips inside and on top of a semiconductor substrate so that each control circuit comprises a contact pad on the side of a first surface of the substrate;
   b) transferring onto the first surface of the substrate a LED stack comprising at least first and second semiconductor layers of opposite conductivity types, so that the second layer of the stack is electrically connected to the contact pads of the control circuits;
   c) forming in each chip a peripheral trench surrounding, in top view, the control circuit and the LED of the chip, the peripheral trench extending vertically in the substrate along the entire height of the control circuit, crossing the second semiconductor layer of the LED stack, and at least partially penetrating into the first semiconductor layer of the LED stack;
   d) forming in each trench a ring-shaped metallization in contact with the first semiconductor layer of the LED stack along the entire length of the trench; and
   e) cutting the substrate and the LED stack along cutting paths located, in top view, outside of the peripheral trenches of the chips to individualize the chips.

2. The method of claim 1, wherein, in each chip:
   the surface of the ring-shaped metallization opposite to the first semiconductor layer of the LED stack emerges onto a second surface of the substrate opposite to the first surface and defines a first connection area of the chip; and
   at least one second electric connection area connected to the control circuit of the chip is formed on the second surface of the substrate.

3. The method of claim 2, wherein the trenches are formed from the second surface of the substrate, after the forming of said at least one second electric connection area.

4. The method of claim 3, wherein the trenches thoroughly cross the substrate and the second semiconductor layer of the LED stack and are interrupted in the first semiconductor layer of the LED stack.

5. The method of claim 4, comprising, between step c) and step d), a step of conformal deposition of an insulating layer on the lateral walls and on the bottom of the trenches, and a step of removing said insulating layer from the bottom of the trenches to free the access to the first semiconductor layer of the LED stack.

6. The method of claim 2, wherein the trenches are formed from the surface of the LED stack opposite to the substrate, before the forming of said at least one second electric connection area.

7. The method of claim 6, wherein the trenches thoroughly cross the LED stack and penetrate into the substrate down to depth greater than or equal to the thickness of the control circuit.

8. The method of claim 7, comprising, between step c) and step d), a step of conformal deposition of an insulating layer on the lateral walls and on the bottom of the trenches, and a step of removing said insulating layer from an upper portion of the lateral walls of the trenches to free the access to the first semiconductor layer of the LED stack.

9. The method of claim 1, further comprising, before step a), a step of depositing a first metal layer continuously extending over substantially the entire first surface of the substrate and a step of depositing a second metal layer continuously extending over substantially the entire surface of the second semiconductor layer of the LED stack opposite to the first semiconductor layer of said stack.

10. The method of claim 9, wherein, at step b), the affixing of the LED stack onto the substrate is performed by direct bonding of the first metal layer to the second metal layer.

11. A method of manufacturing a LED-based emissive display device, comprising the steps of:
- forming a plurality of elementary chips by the method of claim 1;
- forming a transfer substrate comprising, for each chip, on a connection surface of the transfer substrate, a plurality of connection areas intended to be respectively connected to the connection areas of the chip; and
- affixing the chips onto the transfer substrate to electrically connect the chip connection areas to the corresponding connection areas of the transfer substrate.

12. The method of claim 11, wherein, at the end of step e), the chips are arranged on a support substrate with a pitch between chips smaller than the pitch between chips of the final display device; and
- only part of the chips of the support substrate are affixed to the transfer substrate at the pitch of the final display device and are selectively detached from the support substrate.

\* \* \* \* \*